United States Patent [19]

Dumbovic

[11] Patent Number: 5,138,186
[45] Date of Patent: Aug. 11, 1992

[54] SOLID STATE SWITCH WITH LAST STATE MEMORY

[75] Inventor: Steve Dumbovic, Elmhurst, Ill.

[73] Assignee: Illinois Tool Works Inc., Glenview, Ill.

[21] Appl. No.: 553,226

[22] Filed: Jul. 13, 1990

[51] Int. Cl.⁵ .................. H03K 17/56; H03K 3/01
[52] U.S. Cl. .................. 307/246; 307/296.5; 307/584; 307/270; 307/542.1
[58] Field of Search .................. 307/296.4, 296.5, 597, 307/542.1, 270, 584, 594, 246

[56] References Cited

U.S. PATENT DOCUMENTS

| | | | |
|---|---|---|---|
| 4,035,668 | 7/1977 | Minami et al. | 307/255 |
| 4,521,693 | 6/1985 | Johnson | 307/646 |
| 4,530,027 | 7/1985 | Berger | 307/296.4 |
| 4,639,614 | 1/1987 | Basile | 307/571 |
| 4,649,302 | 3/1987 | Damiano et al. | 307/571 |
| 4,851,721 | 7/1989 | Okitaka | 307/570 |
| 4,859,875 | 8/1989 | Tihanyi et al. | 307/270 |
| 5,003,192 | 3/1991 | Beigel | 307/140 |

Primary Examiner—Edward P. Westin
Assistant Examiner—Richard Roseen
Attorney, Agent, or Firm—Donald J. Breh; Davis Chin

[57] ABSTRACT

A solid state switch is provided which has the capability of retaining its last state memory in the event of a power failure or interruption. The solid state switch includes an output driver formed of at least one N-channel MOS field-effect transistor, a holding capacitor, a charging resistor, a transistor-connected diode interconnected between a power supply voltage source and the charging resistor for preventing leakage of the holding capacitor. The field-effect transistor has its drain connected to a first output terminal and it source connected to a second output terminal. One end of the holding capacitor is connected to the gate of the field-effect transistor and its other end is connected to a ground potential. The holding capacitor retains the last state between the first and second output terminals in the event of a loss of the power supply voltage source.

38 Claims, 3 Drawing Sheets

SOLID STATE SWITCH WITH LAST STATE MEMORY

BACKGROUND OF THE INVENTION

This invention relates generally to solid state switches and more particularly, it relates to an improved solid state switch which has the capability of retaining its last state memory in the event of a power failure or interruption.

A prior art search directed to the subject matter of this application in the U.S. Patent and Trademark Office revealed the following U.S. Letters Patent:

4,035,668
4,521,693
4,649,302
4,851,721
4,859,875

In U.S. Pat. No. 4,035,668 to Shunji Minami et al. issued on Jul. 12, 1977, there is disclosed an electronic input-interruption timer which includes an input resistor, a capacitor, a switching element, a MOS field-effect transistor, a discharge resistor and a switching circuit. The switching circuit is operable in response to the magnitude of the drain current of the field-effect transistor so that it is turned off after a time delay in case of an input power interruption. In U.S. Pat. No. 4,851,721 to Takenori Okitaka issued on Jul. 25, 1989, there is disclosed an interconnection circuit of a semiconductor integrated circuit connected between a first circuit for applying an input signal and a second circuit for outputting an output signal which includes a delay means formed of a resistance 7 and a parasitic capacitance 26. The delay means functions to apply an overvoltage supplied to the input 8, which receives the input signal from the first circuit, to a processing means with a delay.

In U.S. Pat. No. 4,859,875 to Jenoe Tihanyi et al. issued on Aug. 22, 1989, there is taught an optocoupler which includes a power FET 1 driven by a photodiode chain 9 across a switch that has two FETs 5 and 6 arranged in series. The photodiode chain 9 is optically coupled to a light-emitting diode 10. Upon illumination of the photodiode chain 9, the first FET 5 is driven into conduction which permits current to flow from a capacitor C connected to a fixed voltage into the gate-source of the power FET 1 and switches on rapidly the same. Upon cessation of the illumination, the second FET 6 is driven into conduction which discharges the gate-source capacitance of the FET 1. As a result, the power FET 1 is blocked.

U.S. Pat. No. 4,649,302 to Michael A. Damiano et issued on Mar. 10, 1987, discloses a solid state switch for controlling a load supplied from either an alternating current or a direct current power supply line. The switch includes a pair of field-effect transistors FET 1 and FET 2 and a common control circuit for applying turn-on signals to the field-effect transistors. The control circuit further includes an opto-isolated logic signal input circuit formed of a light-emitting diode and a phototransistor. U.S. Pat. No. 4,521,693 to Alan L. Johnson issued on Jun. 4, 1985, teaches an optically-coupled/isolated electronic single pole, double throw power relay switch which includes two gate-controlled bidirectional thyristors (triacs).

However, none of the prior art uncovered in the search disclosed a solid state switch which has the capability of retaining its last state memory in the event of a power failure like that of the present invention which includes an output driver formed of an N-channel MOS field-effect transistor, a holding capacitor having its one end connected to the gate of the field-effect transistor and the other end connected to a ground potential, and means interconnected between a power supply voltage source and the other end of a charging resistor for preventing leakage of the holding capacitor.

SUMMARY OF THE INVENTION

Accordingly, it is a general object of the present invention to provide an improved solid state switch having last state retention in the event of a power failure which is relatively simple and economical to manufacture and assemble.

It is an object of the present invention to provide an improved solid state switch having last state retention which includes means for preventing leakage of a holding capacitor.

It is another object of the present invention to provide an improved SPDT solid state switch having last state memory retention which includes means for preventing leakage of a holding capacitor.

It is still another object of the present invention to provide an improved SPDT solid state switch having last state memory retention which includes means for preventing leakage of a holding capacitor and means for isolating the charging of the holding capacitor from the gate of a field-effect transistor.

It is yet still another object of the present invention a SPDT solid state switch having last state memory retention which includes means for preventing leakage of a holding capacitor and feedback control means for rendering a "break-before-make" operation.

In accordance with these aims and objectives, the present invention is concerned with the provision of an improved solid state switch which has the capability of retaining its last state memory in the event of a power failure which includes an output driver, holding means, a charging resistor, a bipolar transistor, and means for preventing leakage of the holding capacitor. The output driver is formed of at least one N-channel MOS field-effect transistor having its drain connected to a first output terminal and its source connected to a second output terminal. The holding capacitor has its one end connected to the gate of the field-effect transistor and its other end connected to a ground potential. The charging resistor has its one end connected to the one end of the capacitor and its other end coupled to a power supply voltage source. The bipolar transistor has its collector connected to the one end of the capacitor, its emitter connected to the ground potential, and its base coupled to receive a logic control signal. The means for preventing leakage of the holding capacitor is formed of a diode interconnected between the power supply voltage source and the other end of the charging resistor. The capacitor retains the last state between the first and second output terminals in the event of a loss of the power supply voltage source.

In a second aspect of the present invention, there is provided a single pole, double throw solid state switch which has the capability of retaining its last state memory in the event of a power failure. In a third aspect of the present invention, there is provided a single pole, double throw solid state switch having last state memory retention which includes diode isolation means for isolating the charging of holding capacitors from the gates of corresponding field-effect transistors.

In a fourth aspect of the present invention, there is provided a single pole, double throw solid state switch having last state memory retention which includes first and second feedback control means for rendering a break-before-make function across the output terminals connected to electrodes of field-effect transistors.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 1:
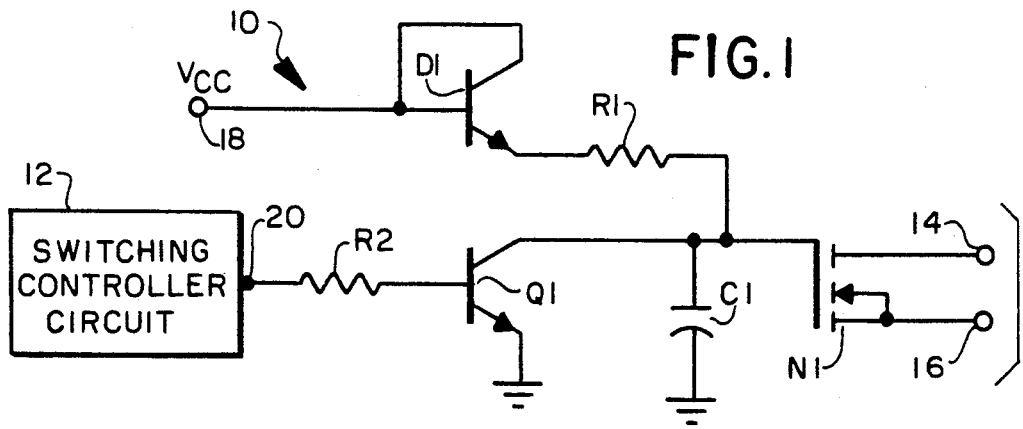
FIG. 1 is a schematic circuit diagram of a first embodiment of a solid state switch with last state memory retention, constructed in accordance with the principles of the present invention.

Referring now in detail to the drawings, there is shown in FIG. 1 a schematic circuit diagram of a first embodiment of a solid state switch 10 of the present invention which has the capability of retaining its last state memory in the event of a power failure or interruption. The solid state switch 10 includes an output driver formed of an N-channel MOS field-effect transistor N1, a charging resistor R1, a holding or storage capacitor C1, a bipolar transistor Q1, a current-limiting resistor R2, and a switching controller circuit 12. The field-effect transistor N1 has its drain electrode connected to a first output circuit terminal 14 and its source electrode connected to a second output circuit terminal 16. The capacitor C1 has its one end connected to the gate electrode of the transistor N1, to one end of the charging resistor R1, and to the collector of the bipolar transistor Q1. The other end of the capacitor C1 is connected to a ground potential. The other end of the resistor R1 is coupled to an operating power supply voltage source VCC applied to input terminal 18. The transistor Q1 has its base connected to one end of the current-limiting resistor R2 and its emitter connected to the ground potential. The other end of the resistor R2 is connected to the output node 20 of the switching controller circuit 12.

The switching controller circuit 12 provides a logic control signal on the output node 20 which is either at a high or low logic level for turning on or off the transistor Q1. Further, the solid state switch 10 includes a diode D1 interconnected between the voltage source VCC and the resistor R1 for preventing discharge of the holding capacitor C1. The diode D1 is formed of a transistor having its base and collector connected together functioning as the anode and its emitter functioning as the cathode.

Assuming initially that a high logic level exists at the output node 20 and that the voltage source VCC has been applied to the input terminal 18. Under this condition, the transistor Q1 will be rendered conductive so as to discharge the capacitor C1. Thus, there will be no voltage at the gate electrode of the transistor N1 so as to make it non-conductive. Consequently, there will be no electrical connection between the first and second output terminals 14 and 16 defining a normally-open (N.O.) contact. If a power failure were to occur causing loss of the voltage source VCC, there will still be no voltage on the gate electrode and the normally-open contact across the output terminals 14 and 16 will be retained in the same state as before the power interruption.

Assume now that a low logic level exists at the output terminal 20 and that the voltage source VCC is again applied to the input terminal 18. Under this condition, the transistor Q1 will be rendered non-conductive and the capacitor C1 will be permitted to charge up via the diode D1 and the resistor R1. When the voltage across the capacitor C1 exceeds the threshold voltage $V_{th}$ of the field-effect transistor N1, the transistor N1 will be rendered conductive. As a result, there will be an electrical connection made between the first and second output terminals 14 and 16. If a power failure or interruption were to occur causing loss of the voltage source VCC, the voltage $V_{c1}$ across the capacitor C1 would still be applied to the gate electrode of the transistor N1. Therefore, the electrical connection between the output terminals 14 and 16 will again be retained in the same state as before the power interruption. It will be noted that since the transistor Q1 is turned off the capacitor C1 cannot be discharged through this path. Further, it can be seen that the diode D1 will be reversed bias so as to prevent leakage of the holding capacitor C1.

Figure 2:
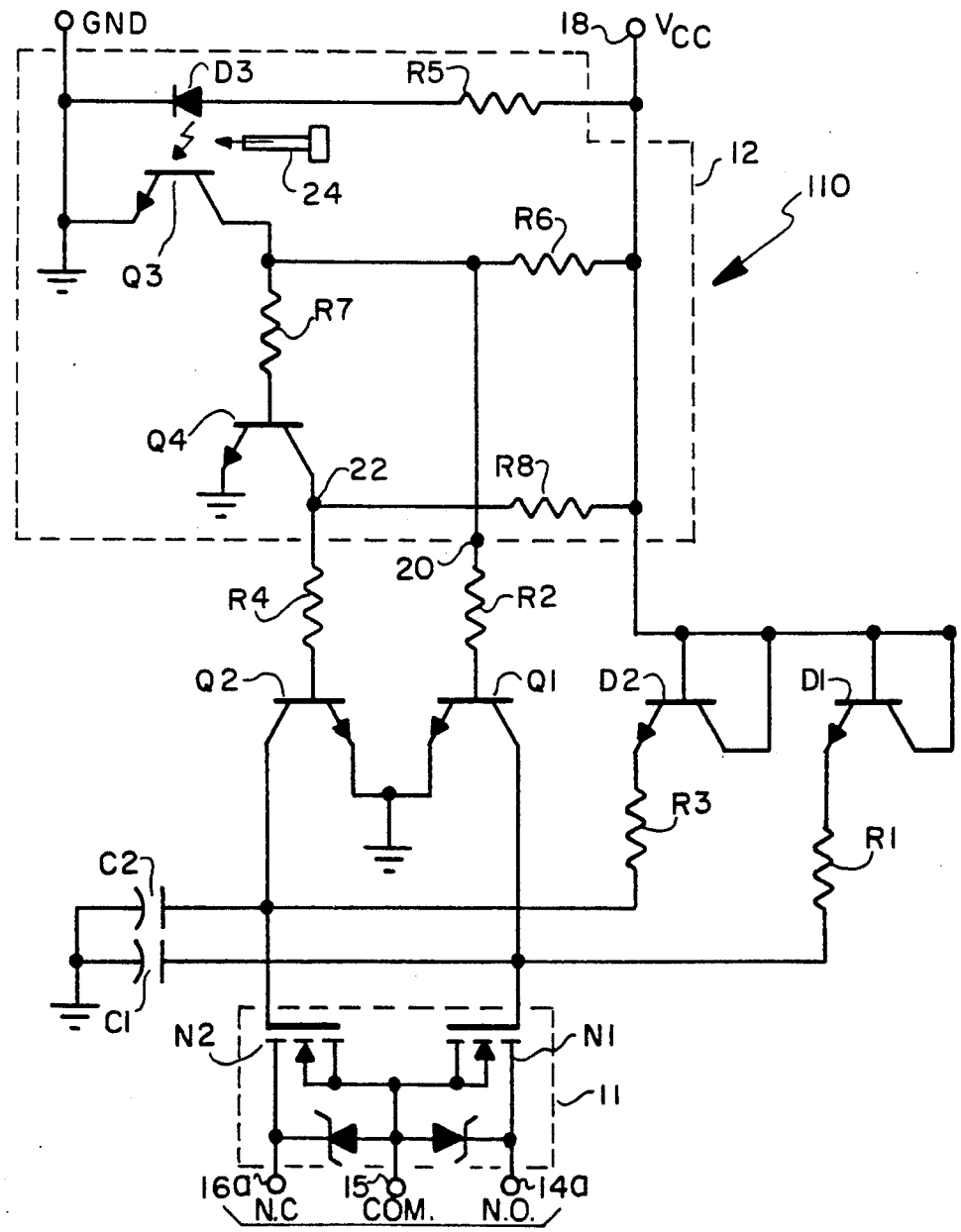
FIG. 2 is a schematic circuit diagram of a second embodiment of the solid state switch of the present invention.

From the foregoing, it will be apparent that the solid state switch 10 provides a single-pole, single throw function across the output terminals 14 and 16 in response to the logic control signal in which the last state is maintained in the event of a power failure. In FIG. 2 of the drawings there is shown a second embodiment of solid state switch 110 of the present invention in which the switch 10 of FIG. 1 has been modified so as to provide a single-pole, double throw function across the output terminals 14a and 16a.

The solid state switch 110 includes an output driver 11 formed of a first N-channel MOS field-effect transistor N1 and a second N-channel MOS field-effect transistor N2 and a switch controller circuit 12. The solid state switch 110 also includes the same diode D1, charging resistor R1, holding capacitor C1, bipolar transistor Q1 and current-limiting resistor R2 as in FIG. 1. In addition, the solid state switch 110 includes second diode D2, second charging resistor R3, second holding capacitor C2, second bipolar transistor Q2, and second current-limiting resistor R4. The field-effect transistor N1 has its drain electrode connected to a first output circuit terminal 14a, and the field-effect transistor N2 has its drain electrode connected to a second output circuit terminal 16a. The source electrodes of the field-effect transistors N1 and N2 are connected together and to a common output circuit terminal 15. The circuit components D1, R1, C1, Q1 and R2 in FIG. 2 are connected in the exact manner as their corresponding components in FIG. 1 and thus their description will not be repeated. Further, the circuit components D2, R3, C2, Q2 and R4 in FIG. 2 are interconnected in substantially the same way as the corresponding circuit components D1, R1, C1, Q2 and R2, except that the gate electrode of the transistor N2 is connected to the capacitor C2 and a second logic control signal at output node 22 of the switch control circuit 12 is connected to the resistor R4.

It should be understood that the switch controller circuit 12 in FIG. 2 may be used in FIG. 1, except that the output node 22 is left unconnected. The switching controller circuit 12 is comprised of an optically coupled isolator or opto-isolator formed of a light source such as a light-emitting diode (LED) D3 and a light-sensitive element such as a phototransistor Q3. The anode of the diode D3 is connected to the voltage source VCC via a load resistor R5, and the cathode of the diode D3 is connected to the ground potential. The phototransistor Q3 has its collector connected to the voltage source VCC via a load resistor R6 and its emitter connected to the ground potential. The switching controller circuit 12 further includes an inverting transistor Q4 and a current-limiting resistor R7. The transistor Q4 has its base connected to one end of the resistor R7 and its emitter connected to the ground potential. The other end of the resistor R7 is connected also to the collector of the phototransistor Q3. The collector of the transistor Q4 is connected to the output node 22 to provide a second logic control signal which is complementary to the first logic control signal at the output node 20.

Let us assume that the manually-operable switch plunger 24 (undepressed state) is disposed so as to interrupt the light from the light-emitting diode D3 to the phototransistor Q3, thereby rendering the transistor Q3 non-conductive. As a result, the first logic control signal at the output node 20 will be at a high logic level and the second logic control signal at the output node 22 will be at a low logic level. Therefore, the capacitor C1 will be discharged causing the field-effect transistor N1 to be turned off so that no electrical connection is made between the first output circuit terminal 14a and the common output circuit terminal 15 defining a normally-open (N.O.) contact. However, the capacitor C2 will be allowed to charge up to the voltage $V_{c2}$ and field-effect transistor N2 will be rendered conductive so as to provide an electrical connection between the second output circuit terminal 16a and the common output circuit terminal 15 defining a normally-closed (N.C.) contact. In the event of a power failure, the normally-open contact will be retained in the same state as before the power interruption due to the capacitor C1 being discharged, and the normally-closed contact will also be retained in the same state due to the holding capacitor C2 maintaining its charged state until its charge leaks out through leakage components in the circuit. Hence, the solid state switch stays in its last state for a pre-set time period, i.e., 30 minutes.

As the switch plunger 24 is depressed so that the light is passed uninterrupted from the light-emitting diode D3 to the phototransistor Q3, the transistor Q3 will be rendered conductive. The first logic control signal at the node 20 will quickly change to a low logic level, and the second logic control signal at the node 22 will quickly change to a high logic level. As a result, the transistor Q2 will be turned on so as to quickly discharge the capacitor C2. Simultaneously, the transistor Q1 will be turned off so as to allow the capacitor C1 to begin charging. Since the capacitor C2 will be discharged quicker through transistor Q2 than the charging of the capacitor C1, the electrical connection between the output terminal 16a and 15 will be disconnected before the electrical connection is made between the output terminals 14a and 15, thereby effecting a "break-before-make" function feature. In the event of a power failure, the normally-open contact being closed will again be retained in the same state as before the power interruption due to the capacitor C1 remaining in its charged state until its charge leaks out, and the normally-closed contact being open will also be retained in the same state due to the holding capacitor C2 being discharged.

Figure 3:
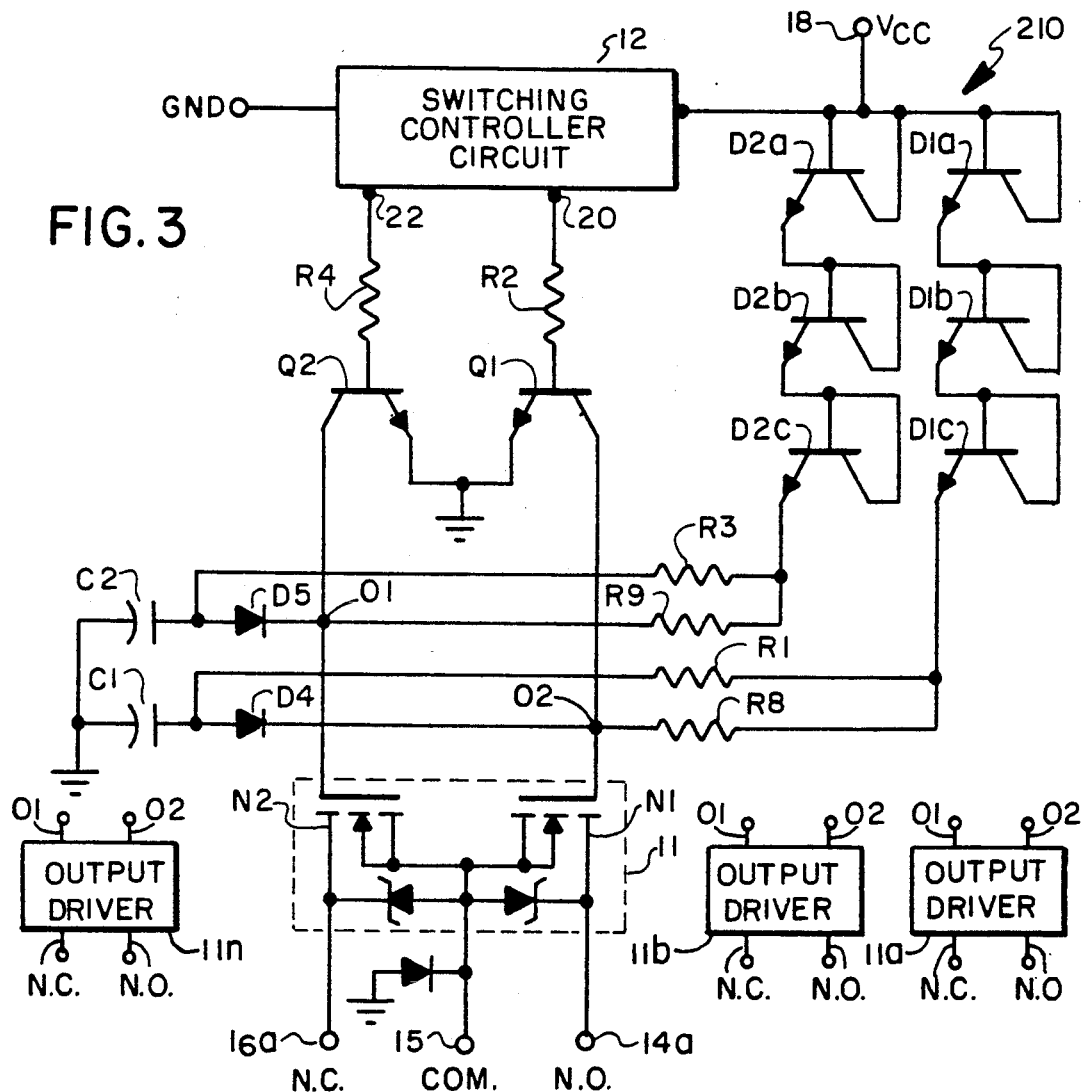
FIG. 3 is a schematic circuit diagram of a third embodiment of the solid state switch of the present invention.

While the solid state switch 110 of FIG. 2 performs adequately under normal circumstances, it has been encountered the problem of possible damage to the field-effect transistors N1 and N2 caused by the slow charging of the uncharged capacitors when the switch plunger is activated repeatedly back and forth. In order to avoid this problem, there is provided a third embodiment of the solid switch 210 of the present invention as is illustrated in FIG. 3. The modifications shown in FIG. 3 include the addition of a resistor R8 and an isolation diode D4 associated with the field effect transistor N1 and a resistor R9 and an isolation diode D5 associated with the field-effect transistor N2. The diodes D4 and D5 serve to isolate the charging of the respective holding capacitors C1 and C2 from the corresponding gates of the field-effect transistors N1 and N2. Further, it will be noted that the diodes D1 and D2 have been replaced with a plurality of series-connected diodes D1a, D1b and D1c, and a plurality of series-connected diodes D2a, D2a and D2c, respectively so as to obtain a higher reversed diode break-down voltage. With these exceptions, the solid state switch 210 of FIG. 3 functions in a substantially similar manner as the solid state switch 110 of FIG. 2 heretofore described.

Figure 4:
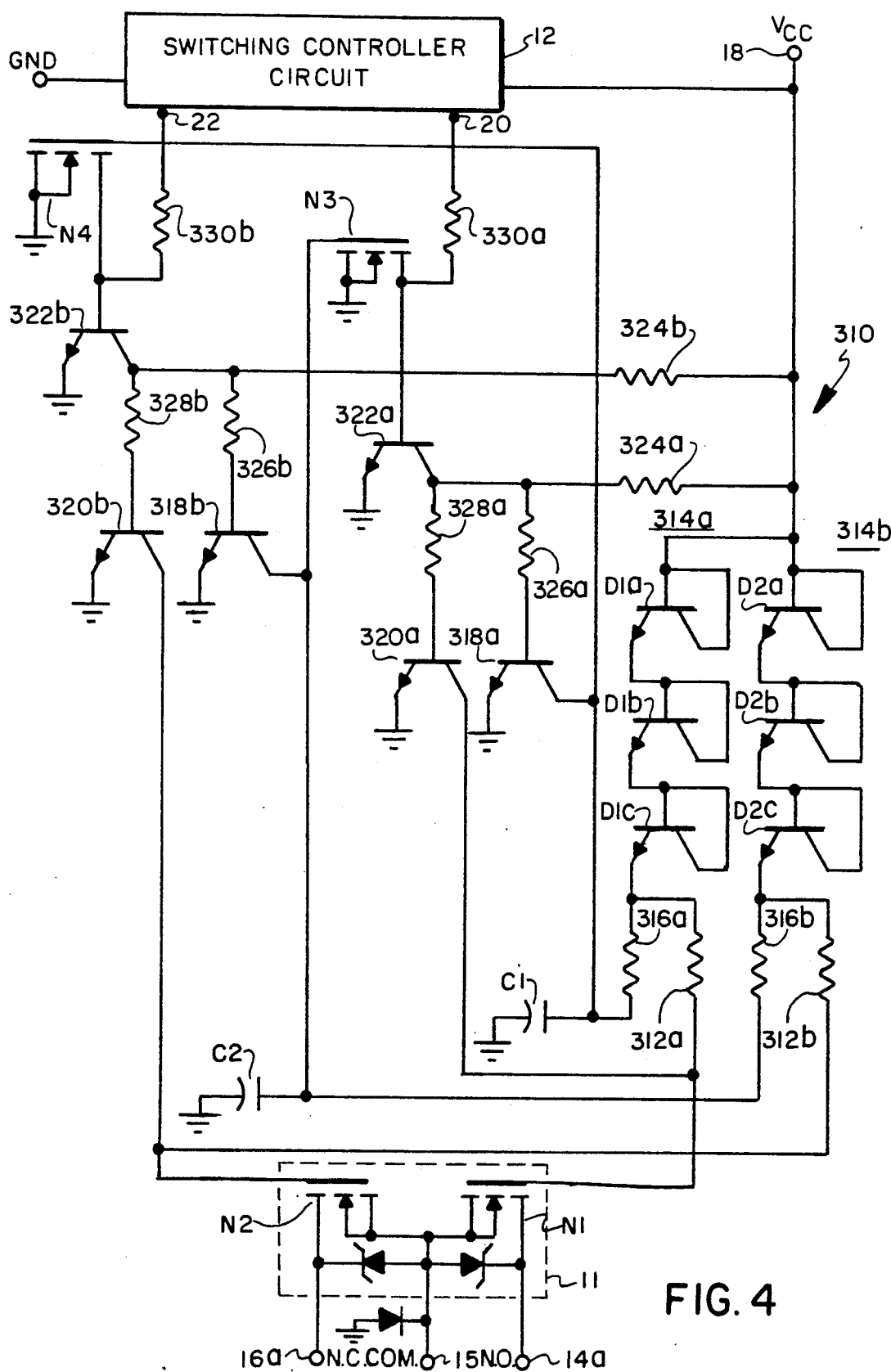
FIG. 4 is a schematic circuit diagram of a fourth embodiment of the solid state switch of the present invention.

Referring now to FIG. 4 of the drawings, there is shown a fourth embodiment of the single-pole, double throw (SPDT) solid state switch 310 of the present invention, which further includes feedback control means for rendering inherently a "break-before-make" function feature. The solid state switch 310 includes an output driver 11 formed of a first N-channel MOS field-effect transistor N1 and a second N-channel MOS field-effect transistor N2 and the switching controller circuit 12 as the circuit of FIG. 2. The field-effect transistor N1 has its drain electrode connected to a first output circuit terminal 14a, and the field-effect transistor N2 has its drain electrode connected to a second output circuit terminal 16a. The source electrodes of the field-effect transistors N1 and N2 are connected together and to a common output circuit terminal 15. The switch 310 further includes a gate resistor 312a, holding capacitor C1, diode means 314a for preventing leakage of the holding capacitor C1, charging resistor 316a, discharging transistor 318a, switching transistor 320a, drive transistor 322a, and current-limiting resistors 324a–330a which are associated with the field-effect transistor N1. The diode means 314a is formed of a plurality of series-connected diodes D1a, D1b and D1c. It will be noted that each of the diodes D1a, D1b and D1c is formed of a transistor having its base and collector connected together functioning as the anode and its emitter functioning as the cathode.

The gate resistor 312a has its one end connected to the gate of the field-effect transistor N1 and its other end connected to the cathode of the diode D1c. The anode of the diode D1a is connected to a voltage source VCC via input terminal 18. The charging resistor 316a has its one end connected to one end of the holding capacitor C1 and its other end connected also to the cathode of the diode D1c. The other end of the capacitor C1 is connected to a ground potential. The discharging transistor 318a has its collector joined to the one end of the capacitor C1, its base joined to one end of the current-limiting resistor 326a, and its emitter joined to the ground potential. The current-limiting resistor 324a is connected between the voltage source VCC and the other end of the current-limiting resistor 326a. The switching transistor 320a has its collector tied to the gate of the field-effect transistor N1, its base connected to one end of the resistor 328a, and its emitter tied to the ground potential. The other end of the resistor 328a is connected to the other end of the resistor 326a. The drive transistor 322a has its collector connected to the other end of the resistor 328a, its base connected to one end of the current-limiting resistor 330a, and its emitter connected to the ground potential. The other end of the resistor 330a is connected to the output node 20 of the switching controller circuit 12.

The solid state switch 310 further includes a gate resistor 312b, holding capacitor C2, diode means 314b for preventing discharge of the holding capacitor C2, charging resistor 316b, discharging transistor 318b, switching transistor 320b, drive transistor 322b, and current-limiting resistors 324b–330b associated with the field-effect transistor N2. The diode means 314b is formed of a plurality of series-connected diodes D2a, D2b and D2c. Each of the diodes D2a, D2b and D2c is formed of a transistor having its base and collector connected together functioning as the anode and its emitter functioning as the cathode.

Similarly, the gate resistor 312b has its one end connected to the gate of the field-effect transistor N2 and its other end connected to the cathode of the diode D2c. The anode of the diode D2a is connected to the voltage source VCC via the input terminal 18. The charging resistor 316b has its one end connected to one end of the holding capacitor C2 and its other end connected also to the cathode of the diode D2c. The other end of the capacitor C2 is connected to the ground potential. The discharging transistor 318b has its collector joined to one end of the capacitor C2, its base joined to one end of the current-limiting resistor 326b, and its emitter joined to the ground potential. The current-limiting resistor 324b is connected between the voltage source VCC and the other end of the resistor 326b. The switching transistor 320b has its collector tied to the gate of the field-effect transistor N2, its base tied to one end of the resistor 328b, and its emitter tied to the ground potential. The other end of the resistor 328b is connected to the other end of the resistor 326b. The drive transistor 322b has its collector connected to the other end of the resistor 328b, its base connected to one end of the current-limiting resistor 330b, and its emitter connected to the ground potential. The other end of the resistor 330b is connected to the output node 22 of the switching controller circuit 12.

The solid state switch 310 further includes feedback control means formed of N-channel MOS field-effect transistors N3 and N4. The transistor N3 has its drain electrode connected to the base of the transistor 322a, its gate electrode connected to the holding capacitor C2, and its source connected to the ground potential. The transistor N4 has its drain electrode connected to the base of the transistor 322b, its gate electrode connected to the holding capacitor C1, and its source connected to the ground potential.

Next, the operation of switch 310 will be described. Assume that a low logic level exists at the output node 20, a high logic level exists at the output node 22, and the voltage source VCC is applied to the input terminal 18. In this case, the drive transistor 322a will be rendered non-conductive and the transistors 318a and 320a will be turned on. As a result, the holding capacitor C1 will be discharged and the gate of the field-effect transistor N1 will be at a low level so as to cause the same to be rendered non-conductive. Thus, there will be no electrical connection between the output terminals 14a and 15. Simultaneously, the drive transistor 322b will be rendered conductive and the transistors 318b and 320b will be turned off. Consequently, the capacitor C2 will be charged up and the gate of the field-effect transistor N2 will be at a high level via diode means 314b and resistor 312b so as to cause the same to be conductive. Accordingly, there will be an electrical connection between the output terminals 16a and 15. In the event of a power failure, the holding capacitor C2 will maintain a high level voltage at the gate of the transistor N2 via the resistors 316b and 312b, and the holding capacitor C1 will maintain a low level voltage at the gate of the transistor N2 via the resistors 316a and 312a. In this manner, the solid state switch 310 will maintain the last state in the event of a power failure.

When the switch plunger 24 is moved so as to interrupt the light from the LED D3, the first logic control signal at the output node 20 will quickly change to a high logic level and the second logic control signal at the output node 22 will quickly change to a low logic level. As a result, the transistor 322b will be quickly turned off causing the transistor 320 to be turned on. This will, in turn, cause a low voltage to appear at the gate of the transistor N2 thereby quickly turning it off so as to open the electrical connection between the output terminal 16a and 15. Since the discharging of the holding capacitor C2 will be longer than the logic transition time, the field-effect transistor N3 will still be on since its gate is controlled by the voltage C2. Consequently, even though the control signal at the output node 20 is at a high logic level, the transistor 322a will be maintained in the off-condition due to the on-condition of the field-effect transistor N3 and thus the voltage at the gate of the field-effect transistor N1 will still be at a low level. This will prevent any electrical connection between the output terminals 14a and 15.

When the holding capacitor C2 is completely discharged, the transistor N3 will turn off causing the transistor 322a to turn on. This will, in turn, cause the transistor 320a to turn off allowing a high voltage to be applied via the diode means 314a and resistor 312a to the gate of the field-effect transistor N1, thereby turning on the same. Only then will an electrical connection be made between the output terminals 14a and 15. In this manner, the feedback control transistors N3 and N4 will render inherently the "break-before-make" function feature.

It should be apparent to those skilled in the art that any number of output drivers as desired could be connected in parallel in the circuits of FIGS. 1 through 4 so as to provide a solid state switch having multiple poles. For example, as shown in FIG. 3, there are shown a plurality of output drivers 11a, 11b, . . . 11n. Each of the output drivers, 11a, 11b, . . . 11n, have common inputs to nodes 01 and 02 in FIG. 3.

From the foregoing detailed description, it can thus be seen that the present invention provides an improved solid state switch which has the capability of retaining its last state memory in the event of a power failure or interruption. The solid state switch of the present invention includes an output driver formed of at least one N-channel MOS field-effect transistor having its drain connected to a first output terminal and its source connected to a second output terminal. A holding capacitor has its one end connected to the gate of the field-effect transistor and its other end connected to a ground potential. Diode means is interconnected between voltage source and a charging resistor for preventing leakage of the holding capacitor. As a result, the holding capacitor retains the last state between the first and second output terminals in the event of a loss of the power supply voltage source.

While there has been illustrated and described what is at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

What is claimed is:

1. A solid state switch which has the capability of retaining its last state memory in the event of a power failure or interruption, said switch comprising:
    output driver means formed of at least one N-channel MOS field-effect transistor having its drain connected to a first output terminal and its source connected to a second output terminal;
    holding means formed of a holding capacitor having its one end connected to the gate of said field-effect transistor and its other end connected to a ground potential;
    a charging resistor having its one end connected to the one end of said holding capacitor;
    a bipolar transistor having its collector connected to the one end of said holding capacitor, its emitter connected to the ground potential, and its base coupled to receive a logic control signal;
    means interconnected between a power supply voltage source and the other end of said charging resistor for preventing leakage of said holding capacitor; and
    said holding capacitor retaining the last state between the first and second output terminals in the event of a loss of the power supply voltage source.

2. A solid state switch as claimed in claim 1, wherein said means for preventing leakage of the holding capacitor comprises at least one diode having its anode connected to the power supply voltage source and its cathode connected to the other end of said charging resistor.

3. A solid state switch as claimed in claim 2, wherein said diode is formed of a transistor having its base and collector connected together to form the anode and its emitter defining the cathode.

4. A solid state switch as claimed in claim 1, wherein said means for preventing the leakage of the holding capacitor comprises a plurality of series-connected diodes having its anode end connected to the power supply voltage source and its cathode end connected to the other end of said charging resistor.

5. A solid state switch as claimed in claim 4, wherein each of said diodes is formed of a transistor having its base and collector connected together to form the anode and its emitter defining the cathode.

6. A solid state switch as claimed in claim 1, further comprising switching controller circuit means for generating said logic control signal.

7. A solid state switch as claimed in claim 6, wherein said switching controller circuit means is comprised of a light-emitting diode and a phototransistor responsive to said light-emitting diode for generating said logic control signal at its collector.

8. A solid state switch as claimed in claim 7, further comprising a current-limiting resistor connected between the collector of said phototransistor and the base of said bipolar transistor.

9. A solid state switch as claimed in claim 1, wherein said output driver means is comprised of a plurality of N-channel MOS field-effect transistors connected whose gates are together so as to provide multiple switch poles.

10. A single-pole, double throw solid state switch which has the capability of retaining its last state memory in the event of a power failure or interruption, said switch comprising;
    output driver means formed of at least one pair of first and second N-channel MOS field-effect transistors, said first field-effect transistor having its drain connected to a first output terminal and its source connected to a common output terminal, said second field-effect transistor having its drain connected to a second output terminal and its source connected to the common output terminal;
    first holding means formed of a first holding capacitor having its one end connected to a gate of said first field-effect transistor and its other end connected to a ground potential;
    a first charging resistor having its one end connected to one end of said first holding capacitor;
    a first bipolar transistor having its collector connected to one end of said first holding capacitor, its emitter connected to the ground potential, and its base coupled to receive a first logic control signal;
    second holding means formed of a second holding capacitor having its one end connected to a gate of said second field-effect transistor and its other end connected to a ground potential;
    a second charging resistor having its one end connected to one end of said second holding capacitor;
    a second bipolar transistor having its collector connected to one end of said second holding capacitor, its emitter connected to the ground potential, and its base coupled to receive a second logic control signal;
    means interconnected between a power supply voltage source and the other ends of said first and second charging resistors for preventing leakage of said first and second holding capacitors; and
    said first holding capacitor retaining the last state between the first and common output terminals and said second holding capacitor retaining the last state between the second and common output terminals in the event of a loss of the power supply voltage source.

11. A solid state switch as claimed in claim 10, wherein said means for preventing leakage of the first and second holding capacitors comprises at least one first and second diodes each having its anode connected to the power supply voltage source and its cathode connected to the other end of said respective first and second charging resistors.

12. A solid state switch as claimed in claim 11, wherein each of said first and second diodes is formed of a transistor having its base and collector connected together to form the anode and its emitter defining the cathode.

13. A solid state switch as claimed in claim 10, wherein said means for preventing the leakage of the first and second holding capacitors comprises a plurality of series-connected first and second diodes each having its anode end connected to the power supply voltage source and its cathode end connected to the other end of said respective first and second charging resistors.

14. A solid state switch as claimed in claim 13, wherein each of said plurality of first and second diodes is formed of a transistor having its base and collector connected together to form the anode and its emitter defining the cathode.

15. A solid state switch as claimed in claim 10, further comprising switching controller circuit means for generating said first and second logic control signals.

16. A solid state switch as claimed in claim 15, wherein said switching controller means is comprised of a light-emitting diode and a phototransistor responsive to said light-emitting diode for generating said first and second logic control signals at respective first and second outputs of said switching controller circuit means.

17. A solid state switch as claimed in claim 16, further comprising first and second current-limiting resistors connected between the first and second outputs of said switching controller circuit means and the bases of said first and second bipolar transistors.

18. A solid state switch as claimed in claim 10, wherein said output driver means is comprised of a plurality of said first and second N-channel MOS field-effect transistors, said plurality of said first N-channel MOS field-effect transistors having their gates connected together and said plurality of said second N-channel MOS field-effect transistors having their gates connected together so as to provide multiple switch poles.

19. A single-pole, double throw solid state switch which has the capability of retaining its last state memory in the event of a power failure or interruption, said switch comprising;

output driver means formed of at least one pair of first and second N-channel MOS field-effect transistors, said first field-effect transistor having its drain connected to a first output terminal and its source connected to a common output terminal, said second field-effect transistor having its drain connected to a second output terminal and its source connected to the common output terminal;

first bipolar transistor having its collector connected to a gate of said first field-effect transistor, its emitter connected to a ground potential, and its base coupled to receive a first logic control signal;

first holding means formed of a first holding capacitor having a first end and a second end connected to the ground potential;

a first charging resistor having its one end connected to the first end of said first holding capacitor;

second bipolar transistor having its collector connected to a gate of said second field-effect transistor, its emitter connected to the ground potential, and its base coupled to receive a second logic control signal;

second holding means formed of a second holding capacitor having a first end and a second end connected to the ground potential;

a second charging resistor having its one end connected to the first end of said second holding capacitor;

means interconnected between a power supply voltage source and the other ends of said first and second charging resistors for preventing leakage of said first and second holding capacitors;

first isolation diode having its anode connected to the first end of said first holding capacitor and its cathode coupled to the collector of said first bipolar transistor, and to a first output of said means for preventing leakage of said first and second holding capacitors;

second isolation diode having its anode connected to the first end of said second holding capacitor and its cathode coupled to the collector of said second bipolar transistor, and to a second output of said means for preventing leakage of said first and second holding capacitors; and said first capacitor retaining the last state between said first and common output terminals and said second holding capacitor retaining the last state between the second and common output terminals in the event of a loss of the power supply voltage source.

20. A solid state switch as claimed in claim 19, wherein said means for preventing leakage of the first and second holding capacitors comprises at least one first and second diodes each having its anode connected to the power supply source and its cathode connected to the other end of said respective first and second charging resistors.

21. A solid state switch as claimed in claim 20, wherein each of said first and second diodes is formed of a transistor having its base and collector connected together to form the anode and its emitter defining the cathode.

22. A solid state switch as claimed in claim 19, wherein said means for preventing the leakage of the first and second holding capacitors comprises a plurality of series-connected first and second diodes each having its anode end connected to the power supply voltage source and its cathode end connected to the other end of said respective first and second charging resistors.

23. A solid state switch as claimed in claim 22, wherein each of said plurality of first and second diodes is formed of a transistor having its base and collector connected together to form the anode and its emitter defining the cathode.

24. A solid state switch as claimed in claim 19, further comprising switching controller circuit means for generating said first and second logic control signals.

25. A solid state switch as claimed in claim 24, wherein said switching controller means is comprised of a light-emitting diode and a phototransistor responsive to said light-emitting diode for generating said first and second logic control signals at respective first and second outputs of said switching controller circuit means.

26. A solid state switch as claimed in claim 24, further comprising first and second current-limiting resistors connected between the first and second outputs of said switching controller circuit means and the bases of said first and second bipolar transistors.

27. A solid state switch as claimed in claim 19, wherein said output driver means is comprised of a plurality of said first and second N-channel MOS field-effect transistors, said plurality of said first N-channel MOS field-effect transistors having their gates connected together and said plurality of said second N-channel MOS field-effect transistors having their gates connected together so as to provide multiple switch poles.

28. A single-pole, double throw solid state switch which has the capability of retaining its last state memory in the event of a power failure or interruption, said switch comprising;
- output driver means formed of at least one pair of first and second N-channel MOS field-effect transistors, said first field-effect transistor having its drain connected to a first output terminal and its source connected to a common output terminal, said second field-effect transistor having its drain connected to a second output terminal and its source connected to the common output terminal;
- a first bipolar transistor having a collector, base and emitter connection to ground;
- a second bipolar transistor having its collector coupled to a gate of said first field-effect transistor and its emitter connected to a ground potential;
- first holding means formed of a first holding capacitor having a first end connected to the collector of said first bipolar transistor and a second end connected to the ground potential;
- a first charging resistor having its one end connected to the first end of said first holding capacitor and its other end coupled to a power supply voltage source;
- a third bipolar transistor having its collector coupled to the bases of said first and second bipolar transistors, its emitter connected to the ground potential, and its base coupled to receive a first logic control signal;
- a fourth bipolar transistor having a collector, base and emitter connected to ground;
- a fifth bipolar transistor having its collector coupled to the gate of said second field-effect transistor and its emitter connected to the ground potential;
- second holding means formed of a second holding capacitor having a first end connected to the collector of said fourth bipolar transistor and a second end connected to the ground potential;
- a second charging resistor having its one end connected to the first end of said second holding capacitor and its other end coupled to the power supply voltage source;
- a sixth bipolar transistor having its collector coupled to the bases of said fourth and fifth bipolar transistors, its emitter connected to the ground potential, and its base coupled to receive a second logic control signal.
- first feedback control means connected between the first end of said second holding capacitor and the base of said third bipolar transistor;
- second feedback control means connected between the first end of said first holding capacitor and the base of said sixth bipolar transistor; and
- said first and second feedback control means rendering a "break-before-make" function across the first and second output terminals.

29. A solid state switch as claimed in claim 28, further comprising first and second diodes each having its anode connected to the power supply voltage source and its cathode connected to the other end of said respective first and second charging resistors.

30. A solid state switch as claimed in claim 29, wherein each of said first and second diodes is formed of a transistor having its base and collector connected together to form the anode and its emitter defining the cathode.

31. A solid state switch as claimed in claim 28, further comprising a plurality of series-connected first and second diodes each having its anode end connected to the power supply voltage source and its cathode end connected to the other end of said respective first and second charging resistors.

32. A solid state switch as claimed in claim 31, wherein each of said plurality of first and second diodes is formed of a transistor having its base and collector connected together to form the anode and its emitter defining the cathode.

33. A solid state switch as claimed in claim 28, further comprising switching controller circuit means for generating said first and second logic control signals.

34. A solid state switch as claimed in claim 28, wherein said switching controller means is comprised of a light-emitting diode and a phototransistor responsive to said light-emitting diode for generating said first and second logic control signals at respective first and second outputs of said switching controller circuit means.

35. A solid state switch as claimed in claim 34, further comprising first and second current-limiting resistors connected between the first and second outputs of said switching controller circuit means and the bases of said first and second bipolar transistors.

36. A solid state switch as claimed in claim 28, wherein said output driver means is comprised of a plurality of said first and second N-channel MOS field-effect transistors, said plurality of said first N-channel MOS field-effect transistors having their gates connected together and said plurality of said second N-channel MOS field-effect transistors having their gates connected together so as to provide multiple switch poles.

37. A single-pole, double throw solid state switch as claimed in claim 28, wherein said first feedback control means comprises a third MOS field-effect transistor.

38. A single-pole, double throw solid state switch as claimed in claim 37, wherein said second feedback control means comprises a fourth MOS field-effect transistor.

* * * * *